US012738465B2

(12) United States Patent
Miyamoto et al.

(10) Patent No.: US 12,738,465 B2
(45) Date of Patent: Sep. 15, 2026

(54) SURFACE MODIFICATION METHOD

(71) Applicant: SEKISUI CHEMICAL CO., LTD., Osaka (JP)

(72) Inventors: Eiji Miyamoto, Kyoto (JP); Masato Akahori, Kyoto (JP); Hideki Kondo, Kyoto (JP); Mamoru Hino, Kyoto (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 428 days.

(21) Appl. No.: 18/281,345

(22) PCT Filed: Mar. 11, 2022

(86) PCT No.: PCT/JP2022/011062
§ 371 (c)(1),
(2) Date: Sep. 11, 2023

(87) PCT Pub. No.: WO2022/196580
PCT Pub. Date: Sep. 22, 2022

(65) Prior Publication Data
US 2024/0162018 A1 May 16, 2024

(30) Foreign Application Priority Data
Mar. 16, 2021 (JP) ................................ 2021-042106

(51) Int. Cl.
*H01J 37/32* (2006.01)
*C08J 7/12* (2006.01)

(52) U.S. Cl.
CPC ......... *H01J 37/32825* (2013.01); *C08J 7/123* (2013.01); *H01J 37/32073* (2013.01);
(Continued)

(58) Field of Classification Search
CPC ........... H01J 37/32825; H01J 37/32073; H01J 37/32348; H01J 37/3244; H01J 37/32541; C08J 7/123
(Continued)

(56) References Cited

U.S. PATENT DOCUMENTS

2013/0084409 A1* 4/2013 Vangeneugden ... H01J 37/3277 118/718
2018/0376577 A1* 12/2018 Nakano .............. H01J 37/3277
(Continued)

FOREIGN PATENT DOCUMENTS

| JP | 6-228343 | 8/1994 |
|---|---|---|
| JP | 2002-020514 | 1/2002 |

(Continued)

OTHER PUBLICATIONS

International Search Report issued May 24, 2022 in International (PCT) Application No. PCT/JP2022/011062.
(Continued)

*Primary Examiner* — Charlee J. C. Bennett
(74) *Attorney, Agent, or Firm* — Wenderoth, Lind & Ponack, L.L.P.

(57) ABSTRACT

The adhesiveness of a treatment target made of a fluorine-based hard-to-adhere material is improved. A process gas containing any one or two or more among carbon monoxide, carbon dioxide, hydrogen, water vapor, ethanol, propanol, hexanol, ethylene glycol, and ammonia is supplied from a process gas supply unit 10 to a plasma generation unit 20. In the plasma generation unit 20, the process gas is activated by plasma and is brought into contact with a treatment target 9, and through a reaction caused by the contact, the residual ratio of fluorine atoms on a surface of the treatment target 9 is adjusted to 60% or less of that before the contact, and any one among a carbon atom, a hydrogen atom, and an oxygen
(Continued)

atom, or a molecule containing one or more of these atoms is provided to the surface of the treatment target.

5 Claims, 3 Drawing Sheets

(52) U.S. Cl.
CPC .... *H01J 37/32348* (2013.01); *H01J 37/3244* (2013.01); *H01J 37/32541* (2013.01); *C08J 2327/12* (2013.01)

(58) Field of Classification Search
USPC .......................................................... 118/715
See application file for complete search history.

(56) References Cited

U.S. PATENT DOCUMENTS

2020/0306802 A1 10/2020 Aiba et al.
2021/0009777 A1 * 1/2021 Vesel ....................... C08J 7/123

FOREIGN PATENT DOCUMENTS

| | | |
|---|---|---|
| JP | 2006-294571 | 10/2006 |
| JP | 5152784 B2 * | 2/2013 |
| JP | 2016-030769 | 3/2016 |
| JP | 2019-137731 | 8/2019 |
| JP | 2020-157679 | 10/2020 |
| WO | 2019/124321 | 6/2019 |

OTHER PUBLICATIONS

International Preliminary Report on Patentability issued Sep. 12, 2023 in International (PCT) Application No. PCT/JP2022/011062.
Extended European Search Report issued Mar. 3, 2025 in European Application No. 22771328.6.
Hong et al., "Hydrophilic Surface Modification of Polytetrafluoroethylene Film with Gliding Are Plasma", Applied Science and Convergence Technology, Jul. 2019, vol. 28, No. 4, pp. 101-106.
Shao et al., "Research on Surface Modification of Polytetrafluoroethylene Coupled with Argon Dielectric Barrier Discharge Plasma Jet Characteristics", IEEE Transactions on Plasma Science, Nov. 2011, vol. 39, No. 11, pp. 3095-3102.
Chinese Office Action issued Jan. 9, 2026 in corresponding Chinese Patent Application No. 202280021802.3, with partial English language translation.

* cited by examiner

SURFACE MODIFICATION METHOD

TECHNICAL FIELD

The present invention relates to a method for surface-modifying a treatment target made of a hard-to-adhere material, and particularly to a surface modification method for a fluorine-based hard-to-adhere material containing a fluorine atom.

BACKGROUND ART

For example, fluorine-based resins such as polytetrafluoroethylene (PTFE) and ethylene tetrafluoroethylene (ETFE) have low wettability, and aqueous adhesives such as polyvinyl alcohol (hereinafter, appropriately referred to as "PVA")-based adhesives or polyether-based adhesives do not adhere well to those resins. In order to improve the adhesiveness (wettability or hydrophilicity) of such fluorine-based hard-to-adhere materials, wet treatment using a chemical solution has been conventionally performed (see, for example, Patent Literature 1), but this method requires disposal of waste liquid and has problems such as high running cost and environmental load. In view of this, dry treatment has been proposed in which a process gas is activated by plasma or the like and is brought into contact with a hard-to-adhere material (see, for example, Patent Literature 2).

In Patent Literature 2, a mixed gas obtained by adding water vapor to an inert gas such as helium, argon, neon, or nitrogen is used as a process gas. The process gas is activated by supplying the process gas to between a pair of electrodes and generating atmospheric pressure plasma through the application of a high-frequency voltage of several hundred kHz to several tens MHz to between the electrodes. In parallel, a treatment target made of fluororesin film is stretched between support rolls located on both sides of the pair of electrodes forming a parallel plate electrode to pass between the pair of electrodes. Thus, the treatment target is surface-modified by plasma application.

CITATION LIST

Patent Literatures

Patent Literature 1: JP H06-228343 A

Patent Literature 2: JP 2006-294571 A

SUMMARY OF INVENTION

Technical Problem

In the dry treatment by plasma of Patent Literature 2 cited above, details of the modification step are not disclosed, and it is unclear how the surface state of the fluorine-based hard-to-adhere material is changed to obtain a desired degree of surface modification. In particular, it is considered that the supplied energy is insufficient and the residual ratio of fluorine atoms on the surface of the treatment target is high, and the wettability and the adhesiveness may not be sufficiently improved. In addition, in the treating apparatus of Patent Literature 2, since the treatment target is treated with the treatment target floating between the pair of electrodes, the treating region cannot be widened due to the influence of wrinkles or slack, and as a result, there is a possibility that sufficient treating performance cannot be exhibited. In addition, in a case where only one surface of the treatment target is intended to be treated, there is a possibility that the surface that is intended not to be treated is also treated. On the other hand, when the treatment target is conveyed with the treatment target being kept in contact with any one of the electrodes, the treatment target is damaged.

In view of such circumstances, it is a primary (first) purpose of the present invention to present a surface state for acquiring a desired degree of surface modification in dry-treating, with plasma, a treatment target made of a fluorine-based hard-to-adhere material containing a fluorine atom and sufficiently improve the wettability and eventually the adhesiveness of the fluorine-based hard-to-adhere material. In addition, a second purpose is to make it possible to reliably treat only a surface that is intended to be treated with being less affected by wrinkles or slack and without damaging the treatment target.

Solution to Problem

As a result of intensive studies to solve the problems, the present inventors have found that the wettability of a hard-to-adhere material is improved by setting conditions such that the rate of decrease in the content of fluorine atoms on the surface of a fluorine-based hard-to-adhere material by plasma using a process gas to which a specific gas component is added falls within a prescribed range.

The present invention has been made based on this finding, and is a method for surface-modifying a treatment target made of a hard-to-adhere material containing a fluorine atom, the method comprising:

a plasma step of activating a process gas containing any one or two or more among carbon monoxide, carbon dioxide, hydrogen, water vapor, ethanol, propanol, hexanol, ethylene glycol, and ammonia by plasma and bringing the process gas into contact with the treatment target; and a modification step of, through a reaction caused by the contact, adjusting a residual ratio of fluorine atoms on a surface of the treatment target to 60% or less of a residual ratio before the contact and providing any one among a carbon atom, a hydrogen atom and an oxygen atom or a molecule containing one or more of these atoms to the surface of the treatment target. This makes it possible to sufficiently improve the wettability and the adhesiveness of a fluorine-based hard-to-adhere material, and the first purpose can be achieved.

Preferably, the plasma step includes:

a generation step of generating plasma discharge near atmospheric pressure by applying an electric field to an interelectrode space defined by a pair of electrodes, a supply step of supplying the process gas to the interelectrode space, and a contact step of bringing the process gas in the interelectrode space or having passed through the interelectrode space into contact with the treatment target.

Herein, the term "near atmospheric pressure" refers to a range of $1.013\times10^4$ to $50.663\times10^4$ Pa, and in consideration of facilitation of pressure adjustment and simplification of a device configuration, it is preferably $1.333\times10^4$ to $10.664\times10^4$ Pa, and more preferably $9.331\times10^4$ to $10.397\times10^4$ Pa.

Preferably, an amount of energy input in the plasma step is 0.9 J/cm$^2$ to 135.0 J/cm$^2$ per unit area of the surface of the treatment target.

When the amount of energy input is less than 0.9 J/cm$^2$, a sufficient effect on surface-modifying the hard-to-adhere material is not acquired.

When the amount of energy input exceeds 135.0 J/cm$^2$, the adhesive strength is rather lowered due to damage of the hard-to-adhere material.

Preferably, the plasma step includes a step in which the treatment target passes through in the interelectrode space.

Preferably, the plasma step includes a step of applying a pulse wave-like voltage to between the pair of electrodes to generate pulse plasma near atmospheric pressure in the interelectrode space.

A peak-to-peak voltage of a voltage applied to between the pair of electrodes is preferably 3 kVpp to 25 kVpp, and more preferably 12 kVpp to 20 kVpp, and the frequency is preferably 10 kHz to 70 kHz, and more preferably 20 kHz to 55 kHz.

Preferably, the treatment target has a film shape, the pair of electrodes includes a roll-shaped ground electrode and a hot electrode disposed facing the ground electrode, and in the plasma step, the treatment target is conveyed in contact with the ground electrode, and the plasma near the atmospheric pressure is generated between the ground electrode and the hot electrode.

Preferably, the plasma step includes a step of applying a pulse wave-like voltage to between the pair of electrodes to generate pulse plasma near the atmospheric pressure in the interelectrode space.

By conveying the treatment target in contact with the ground electrode, the occurrence of scratches on the treatment target can be eliminated, and only a surface of the treatment target intended to be treated can be treated by applying plasma, and a surface intended not to be treated can be prevented from being treated. In addition, the treating region can be expanded by increasing the number of electrode pairs composed of a hot electrode and a rolled ground electrode. As a result, both quality and performance can be kept good, and the second purpose can be achieved.

Advantageous Effects of Invention

According to the present invention, the wettability and the adhesiveness of a treatment target made of a fluorine-based hard-to-adhere material can be improved, and a desired degree of surface modification can be acquired.

DESCRIPTION OF EMBODIMENTS

In the following, embodiments of the present invention will be described with reference to drawings.

First Embodiment

Figure 1:
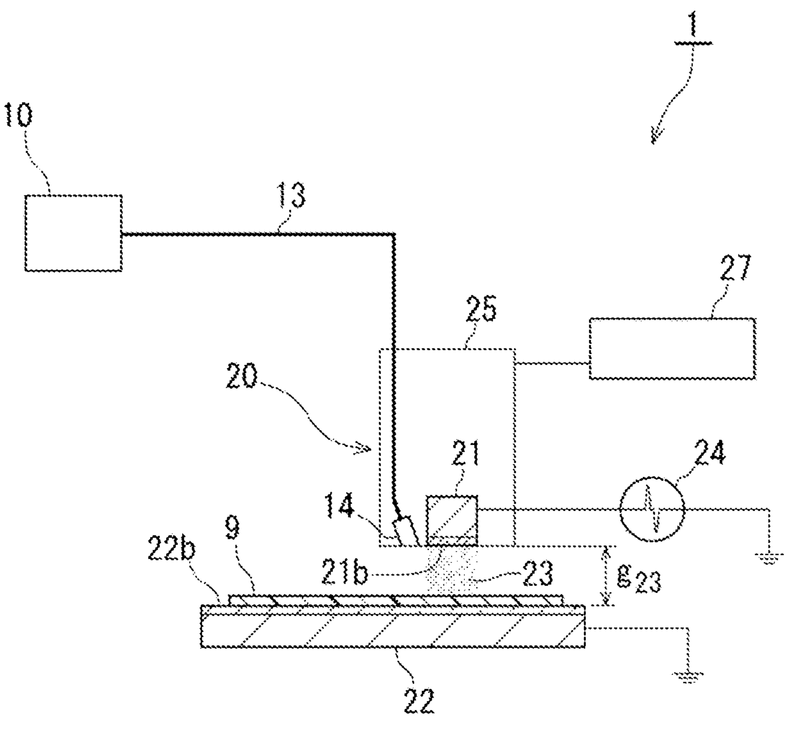
FIG. 1 is a configuration diagram schematically illustrating a surface modification device according to the first embodiment of the present invention.

FIG. 1 illustrates a surface modification device 1 according to the first embodiment of the present invention. A treatment target 9 is a hard-to-adhere material containing fluorine atoms. Examples of such a hard-to-adhere material include fluorine-based resins such as polytetrafluoroethylene (PTFE) and ethylene tetrafluoroethylene (ETFE). The shape of the treatment target 9 is not particularly limited, and may be, for example, a film shape, a plate shape, or a block shape.

The surface modification device 1 modifies the surface of the treatment target 9 made of the hard-to-adhere material to improve adhesiveness, and includes a process gas supply unit 10 and a plasma generation unit 20. The process gas supply unit 10 supplies a process gas to the plasma generation unit 20. The process gas contains any one or two or more among carbon monoxide, carbon dioxide, hydrogen, water vapor, ethanol, propanol, hexanol, ethylene glycol, and ammonia as an additive component.

The additive component is added to a carrier gas to yield the process gas. As an addition means, a mass flow controller (MFC) may be used, or bubbling may be used.

Examples of the carrier gas include an inert gas such as nitrogen ($N_2$). As the carrier gas, a noble gas may be used instead of nitrogen. The carrier gas serves as a carrier gas that conveys the process gas containing the additive component to the plasma generation unit 20 and the treatment target 9, and also serves as a dilution gas that dilutes the additive component and as a discharge generation gas in the plasma generation unit 20.

The plasma generation unit 20 includes a pair of electrodes 21 and 22 and a plasma head 25. The hot electrode 21 is accommodated in the plasma head 25. The hot electrode 21 is formed in an elongated plate shape extending in a treating width direction orthogonal to the plane of FIG. 1. The dimension of the hot electrode 21 in the treating width direction is substantially equal to or slightly larger than the treating width (the dimension in a direction orthogonal to the plane of FIG. 1) of the treatment target 9. The ground electrode 22 is disposed below the plasma head 25. The ground electrode 22 is formed in a flat plate shape (stage shape) that is a quadrangle in plan view having a dimension in the treating width direction equivalent to that of the hot electrode 21. These electrodes 21 and 22 vertically face each other to constitute a parallel plate electrode. On opposing surfaces of the electrodes 21 and 22 are formed solid dielectric layers 21*b* and 22*b*, respectively. The solid dielectric layers 21*b* and 22*b* are made of ceramic, such as alumina. Note that a solid dielectric layer is just required to be provided on at least one of the opposing surfaces of the electrodes.

An interelectrode space 23 is defined between the electrodes 21 and 22. The electrodes 21 and 22 are disposed under a pressure near the atmospheric pressure, and the pressure in the interelectrode space 23 is near the atmospheric pressure. The gap $g_{23}$ of the interelectrode space 23 (the distance between the opposing surfaces of the solid dielectric layers 21*b* and 22*b*) is at least equal to or more than the thickness of the treatment target 9, and preferably is several mm or less. In FIG. 1, the size of the gap $g_{23}$ is exaggerated.

A power source 24 is connected to the hot electrode 21. The ground electrode 22 is electrically grounded.

The power source 24 converts a commercial AC power into a DC power, further converts the DC power into a pulsed high-frequency power, and supplies the high-frequency power to the electrode 21. The peak-to-peak voltage of a pulse wave-like voltage to be applied between the pair of electrodes 21 is preferably 3 kVpp to 25 kVpp, and more preferably 10 kVpp to 16 kVpp. The frequency of the pulse wave-like voltage is preferably 20 kHz to 55 kHz. and more preferably 40 kHz to 50 kHz.

A gas supply line 13 from the process gas supply unit 10 extends to the plasma generation unit 20. A nozzle 14 disposed at the tip of the gas supply line 13 is held in the plasma head 25 and faces the interelectrode space 23. Although not shown in detail in the drawings, the nozzle 14 includes a gas diffusion unit that uniformly diffuses the gas from the gas supply line 13 in the treating width direction (the direction orthogonal to the plane in FIG. 1).

The treatment target 9 is placed on the stage-shaped ground electrode 22. The ground electrode 22 also serves as a support portion for the treatment target 9. The treatment target 9 is supported by the ground electrode 22 as the support portion such that the treatment target 9 comes into contact with the gas in the interelectrode space 23.

The surface modification device 1 constitutes a direct plasma treating apparatus. In the present description, direct plasma treatment refers to surface treatment in which a treatment target 9 is directly exposed to plasma discharge in an interelectrode space 23 by disposing the treatment target 9 in the interelectrode space 23 or passing the treatment target 9 through in the interelectrode space 23.

A movement mechanism 27 is connected to the plasma head 25 and thus the hot electrode 21. Although not shown in detail in the drawings, the movement mechanism 27 includes a drive means such as a motor, and a power transmission means such as a gear and a timing belt. By the movement mechanism 27, the hot electrode 21 and the ground electrode 22 and thus the treatment target 9 are relatively moved to reciprocate in a scanning direction (left-right direction in FIG. 1) orthogonal to the treating width direction.

The movement mechanism 27 may be connected to the ground electrode 22. The ground electrode 22 may be moved with respect to the plasma head 25.

The treatment target 9 is subjected to surface modification (surface treatment) by the surface modification device 1 as follows.

<Plasma Step>

A plasma step and a modification step are performed using the surface modification device 1. In the plasma step, the process gas is activated by plasma and brought into contact with the treatment target 9. Specifically, the plasma step includes a generation step, a supply step, a contact step, and a movement step.

<Generation Step>

A pulse wave-like voltage is applied between the pair of electrodes 21 and 22 by supplying a power, preferably in a pulsed mode, from the power source 24. As a result, a pulsed electric field is applied into the interelectrode space 23, and plasma discharge (dielectric barrier discharge) near the atmospheric pressure is generated. Preferably, a pulsed plasma near the atmospheric pressure is generated.

<Supply Step>

In parallel, the process gas from the process gas supply unit 10 is supplied to the interelectrode space 23 via the supply line 13 and through the nozzle 14.

<Contact Step>

Through this step, the process gas is activated (including plasmatization, excitation, decomposition, radicalization, and ionization) in the interelectrode space 23 (plasma discharge space). The activated process gas is brought into contact with the treatment target 9.

<Movement Step>

Furthermore, the hot electrode 21 is moved in the scanning direction (the left-right direction in FIG. 1) by the movement mechanism 27. As a result, while the treatment target 9 is relatively moved to pass through in the interelectrode space 23, the treatment target 9 comes into contact with an activated process gas and is directly exposed to plasma near the atmospheric pressure (atmospheric pressure direct plasma step). Preferably, it is directly exposed to pulsed plasma near the atmospheric pressure (atmospheric pressure direct pulse plasma step).

The number of treatment, n, for each relative one-way movement of the treatment target 9 in the interelectrode space 23 is not limited to one, and may be a plurality of times. The treatment target 9 may be reciprocated and thereby treated twice per reciprocation. In another adoptable embodiment, a plurality of plasma heads 25 each including a hot electrode 21 are provided, a treatment target 9 passes successively through interelectrode spaces formed by the respective plasma heads 25, and, as a result, the number of the plasma heads 25 corresponds to the number of the times of treatment.

The amount of energy input in the plasma step is preferably 0.9 J/cm$^2$ to 135.0 J/cm$^2$ per unit area of the surface of the treatment target 9. When the process gas contains carbon monoxide, carbon dioxide, water vapor, ethanol, propanol, hexanol, ethylene glycol, or ammonia as an additive component, the amount of energy input is more preferably about 5 J/cm$^2$ to 60 J/cm$^2$, and still more preferably about 10 J/cm$^2$ to 30 J/cm$^2$. When the process gas contains hydrogen as an additive component, the amount of energy input is more preferably about 30 J/cm$^2$ to 120 J/cm$^2$, and still more preferably about 40 J/cm$^2$ to 80 J/cm$^2$ (see FIG. 4 and Examples described later).

The amount of energy input per unit area, E, of the surface of the treatment target 9 is given by the following formula (1).

$$E\ (\text{J/cm}^2)=\text{input power}\ (W)\times\text{treating time (sec)}/\text{treating area}\ (\text{cm}^2) \quad (1)$$

The input power (W) is determined by the product of the DC voltage (V) and the DC current (A) before the high-frequency conversion in the power source 24.

As described above, when the treatment target 9 is moved relative to one or a plurality of plasma heads 25 and treated n times, the amount of energy input per unit area, E, is given by the following formula (2).

$$E=\Sigma Pi/vi\ (i=1,2,\ldots,n) \quad (2)$$

Pi is the input power (W/cm) per unit treating width (unit length in the direction orthogonal to the plane of FIG. 1) when the treatment target 9 is treated for the i-th time.

vi is the relative movement speed (cm/sec) of the treatment target 9 for the i-th time.

<Modification Step>

In each time of treatment, on a surface of the treatment target 9, a reaction occurs due to the contact between the surface molecules of the treatment target 9 and the plasma and the activated process gas. As a result, a fluorine bond in a surface molecule of the treatment target 9 is broken, and a fluorine atom is separated from the surface molecule. Therefore, the proportion (atom %) of fluorine atoms among the atoms constituting the surface of the treatment target 9 decreases. Further, a carbon atom, a hydrogen atom, an oxygen atom, and the like derived from the process gas or the atmospheric gas (air) are bonded to the bond made free by the breakage. In this manner, the residual ratio of fluorine atoms on the surface of the treatment target 9 is adjusted to 60% or less of that before the contact (untreated), and any one among a carbon atom, a hydrogen atom, and an oxygen atom, or a molecule containing one or more of them is provided to the surface of the treatment target 9. By adjusting the amount of energy input E or the like, the residual ratio of fluorine atoms can be reliably brought within the above preferred range.

As a result, a hydrophilic layer is formed on the surface of the treatment target 9, whereby the contact angle of the treatment target 9 with respect to water decreases, the wettability is improved, and the adhesiveness is improved. In other words, the surface of the treatment target 9 is modified.

Next, other embodiments of the present invention will be described. In the following embodiments, the same reference numerals are given to the drawings and the description thereof will be omitted for the configurations overlapping with the above-described embodiment.

Second Embodiment

Figure 2:
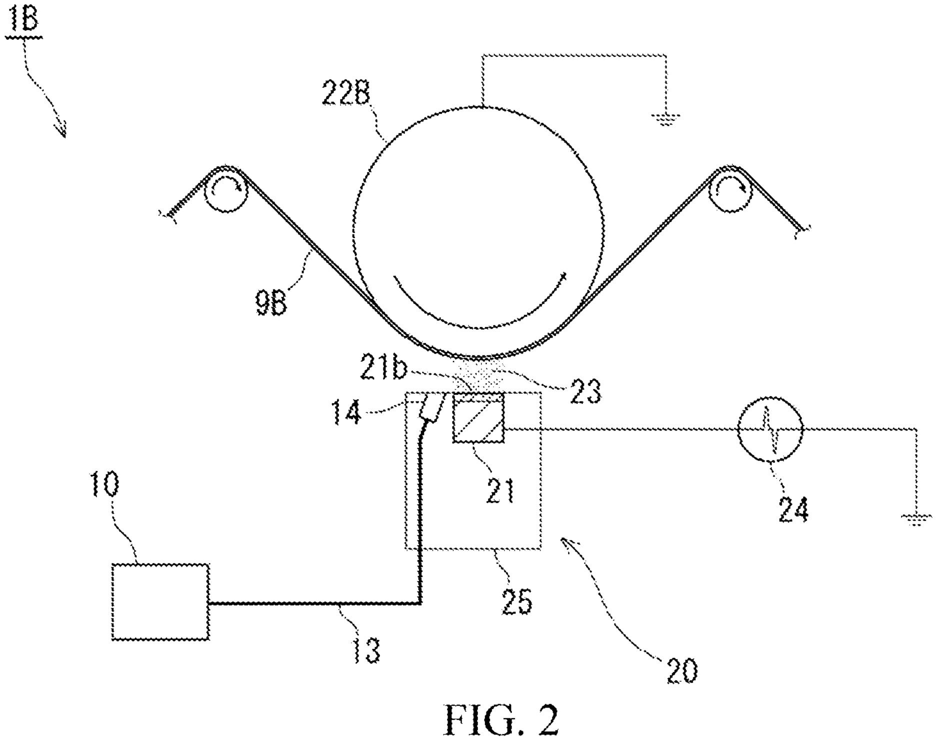
FIG. 2 is a configuration diagram schematically illustrating a surface modification device according to the second embodiment of the present invention.

FIG. 2 illustrates the second embodiment of the present invention. The surface modification device 1B in the second embodiment is an atmospheric pressure direct plasma treating apparatus including an elongated flat plate-shaped hot electrode 21 and a rolled (cylindrical) ground electrode 22B (hereinafter referred to as "roll electrode 22B") as a pair of electrodes. A power source 24 is connected to the hot electrode 21, and the roll electrode 22B is electrically grounded.

A plasma head 25 including the hot electrode 21 and a nozzle 14 is disposed below the roll electrode 22B. The roll electrode 22B and the hot electrode 21 face each other with an interelectrode space 23 interposed therebetween. The longitudinal direction of the hot electrode 21 and the axis of the roll electrode 22B are oriented in the treating width direction (the direction orthogonal to the plane of FIG. 2).

In FIG. 2, the gap between the electrodes 21 and 22B (the size of the interelectrode space 23) is exaggerated.

Although not illustrated, a solid dielectric layer is formed on the outer peripheral surface of the roll electrode 22B.

The plasma head 25 may be disposed above the roll electrode 22B.

The treatment target 9B in the second embodiment is a continuous film made of a hard-to-adhere material containing a fluorine atom, such as a PTFE film or an ETFE film. The treatment target 9B is wound about half round on a peripheral surface portion on the lower side (the side facing the electrode 21) of the roll electrode 22B. Thus, the treatment target 9B is passed through the interelectrode space 23.

The roll electrode 22B is rotated about its own axis. Thus, the treatment target 9B is conveyed in a substantially right direction in FIG. 2. The roll electrode 22B serves as both a support portion and a movement mechanism for the treatment target 9B.

In parallel, a pulse plasma near the atmospheric pressure is generated in the interelectrode space 23 by the application of the high-frequency pulse voltage from the power source 21. Further, a process gas is supplied through the nozzle 14 to the interelectrode space 23 and is activated. By bringing the plasma and the activated process gas into contact with the treatment target 9B, the treatment target 9B is surface-modified, and the adhesiveness is improved.

With the device 1B of the second embodiment, conveying the film-shaped treatment target 9B in contact with the roll electrode 22B can prevent the treatment target 9B from being damaged. In addition, by making a surface of the treatment target 9B intended to be treated face the front side, only the surface intended to be treated can be treated by applying plasma. The surface intended not to be treated can be prevented from being treated by making the surface intended not to be treated face the back side and bringing the surface in contact the roll electrode 22B. Furthermore, the treating region can be enlarged by increasing the number of the pair of the electrodes 21 and 22B. As a result, both quality and performance can be kept good.

Third Embodiment

Figure 3:
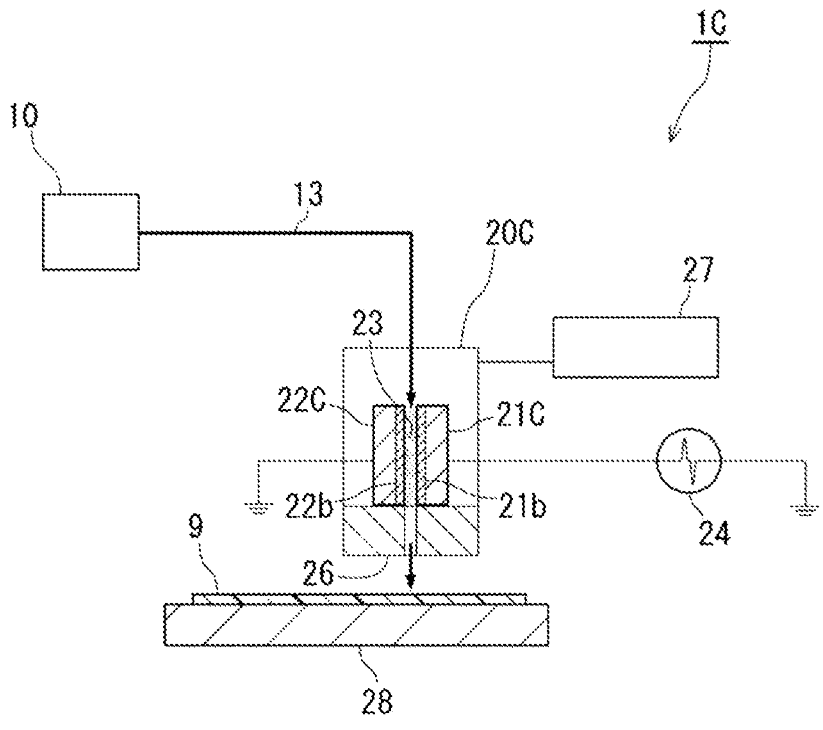
FIG. 3 is a configuration diagram schematically illustrating a surface modification device according to the third embodiment of the present invention.

FIG. 3 illustrates the third embodiment of the present invention.

The surface modification device 1C of the third embodiment constitutes an atmospheric pressure remote plasma treating apparatus. In the present description, remote plasma treatment refers to surface treatment in which a treatment target is disposed away from an interelectrode space (a plasma discharge space) and the plasma generated from the interelectrode space and the treatment target are brought into contact with each other outside the interelectrode space.

Specifically, the surface modification device 1C includes a plasma head 20C (plasma generation unit) and a stage 28. The plasma head 20C includes therein a pair of a hot electrode 21C and a ground electrode 22C held to face each other in the left-right direction. A power source 24 is connected to the hot electrode 21C. The ground electrode 22C is electrically grounded. The pair of electrodes 21C and 22C are both formed in a flat plate shape and constitute a parallel plate electrode, but are not limited thereto, and may be in a coaxial cylindrical shape.

An interelectrode space 23 is formed between the pair of electrodes 21C and 22C facing each other. A gas supply line 13 is connected to an upper end portion of the interelectrode space 23.

A nozzle 26 including a ceramic plate or the like is provided at a lower end portion of the plasma head 20C. A lower end portion of the interelectrode space 23 is connected to the nozzle 26.

A stage 28 is disposed below the plasma head 20C. A treatment target 9 is placed on the upper surface of the stage 28. The stage 28 constitutes a support portion that supports the treatment target such that the treatment target comes into contact with the process gas after passing through the interelectrode space 23.

In the surface modification device 1C, the process gas from the process gas supply unit 10 is introduced into the interelectrode space 23 and activated.

The activated process gas is blown downward through the nozzle 26 and comes into contact with the treatment target 9. Thus, the surface of the treatment target 9 is modified.

Furthermore, the plasma head 20C is moved with respect to the stage 28, whereby the entire region of the treatment target 9 is treated.

The stage 28 may be moved with respect to the plasma head 20C.

The present invention is not limited to the embodiments described above, and various modifications can be made without departing from the gist thereof.

For example, the discharge form for forming plasma is preferably glow discharge, but may be corona discharge, streamer discharge, arc discharge, or other various discharge forms. In addition, an electrode shape in which a dielectric barrier is provided between discharge electrodes is preferable.

The plasma is not limited to one formed by discharge at the atmospheric pressure, and may be one formed by discharge under vacuum.

Example 1

Next, examples will be described. The present invention is not limited to the following examples.

In Example 1, an atmospheric pressure direct plasma apparatus including a parallel plate electrode was prepared.

The hard-to-adhere material of the treatment target was film-shaped PTFE. The atomic composition of the surface of the blank (untreated) treatment target was fluorine (F) 67.6 atom % and carbon (C) 32.4 atom %.

The treatment target was placed on the lower ground electrode 22 of the pair of electrodes forming the parallel plate electrode, and was opposed to the upper hot electrode 21.

The process gas contained nitrogen ($N_2$) as a carrier gas, and carbon monoxide (CO) was added thereto as an additive component. The amount of carbon monoxide added was 5 L/min.

The total flow rate of the process gas was 50 L/min.

The process gas was supplied to the interelectrode space, a pulsed high-frequency electric field was applied to between the electrodes to generate atmospheric pressure pulse plasma between the electrodes, and the treatment target was irradiated with the plasma. Further, the process gas activated by the plasma was brought into contact with the treatment target.

The amount of energy input per unit area was adjusted by varying the DC power before high-frequency conversion in the power source 24. The amount of energy input per unit area when the peel strength described later reached the maximum was E=11.3 J/cm$^2$.

The pulse wave-like voltage applied had a peak-to-peak voltage of 17 kVpp and a frequency of 50 kHz.

After the treatment, the atomic composition of the surface of the treatment target was analyzed by X-ray photoelectron spectroscopy (XPS). As an analyzer, a spectrometer PH15000 VersaProbe II manufactured by ULVAC-PHI, Inc. was used.

As shown in Table 1, the analysis results were fluorine (F) 5.5 atom %, carbon (C) 45.3 atom %, nitrogen (N) 28.9 atom %, and oxygen (O) 20.2 atom %.

Therefore, the residual ratio of fluorine atoms on the surface of the treatment target after the treatment relative to the untreated state (before the treatment) was (5.5/67.6) =8.2%.

It is considered that the nitrogen (N) in the surface atomic composition was derived from nitrogen molecules ($N_2$) in the carrier gas and the air.

In addition, although hydrogen (H) cannot be detected by XPS, as hydrophilicity was enhanced after the treatment, it is presumed that a hydrogen atom-containing group such as OH, NH or CH derived from a hydrogen-containing molecule such as water vapor ($H_2O$) in the air was provided to the surface of the treatment target.

Figure 5:
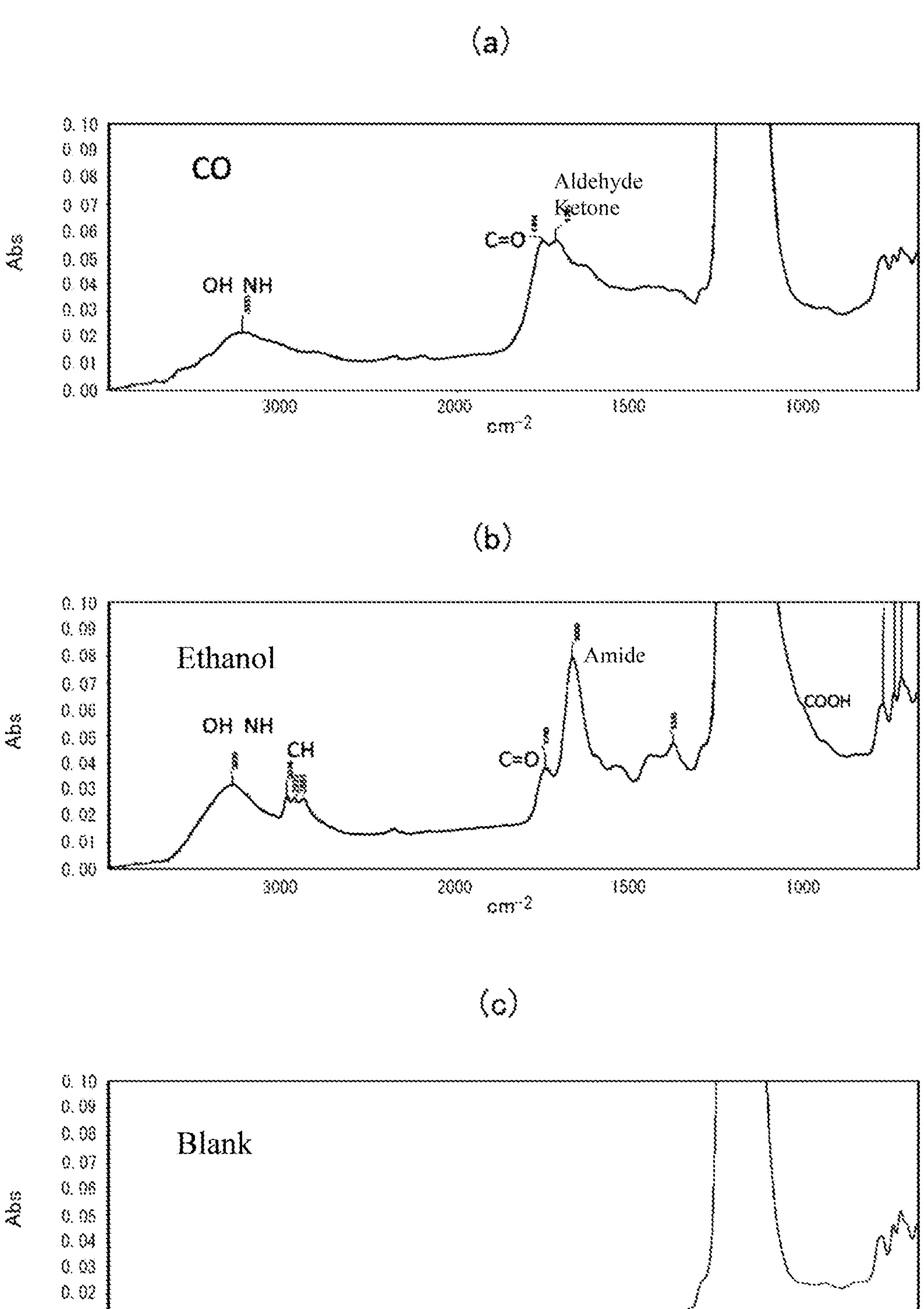
FIG. 5 is a spectrum diagram produced by infrared spectroscopic analysis in Examples.

Actually, when the treatment target was subjected to infrared light analysis, hydrogen atom-containing groups such as OH and NH were confirmed as shown in FIG. 5(*a*).

As an infrared spectroscopic analyzer, Nicolet iN10MX manufactured by Thermo Scientific was used.

As evaluation, two film pieces were cut out from the treatment target film after the treatment, these film pieces were bonded together, and then the peel strength was measured by a peeling test.

An acrylic adhesive was used as an adhesive (pressure-sensitive adhesive).

The peel test was a T-peel test in accordance with JIS K 6854-3.

The peel strength in the peel test was evaluated in three grades (see FIG. 4) where the peel strength of an untreated sample was defined as 1; a peel strength 2.5 times or more of that of the untreated sample was rated as excellent (⊙); a peel strength 1.5 times or more and less than 2.5 times of that of the untreated sample was rated as good (Ø); and a peel strength 1.5 times or less of that of the untreated sample was rated as poor (x). As a result, the peel strength was excellent (⊙).

Example 2

In Example 2, carbon dioxide ($CO_2$) was used as an additive component of the process gas.

The added amount was 10 L/min.

The amount of energy input per unit area when the peel strength described later reached the maximum was E=32.3 J/cm$^2$.

Other treatment conditions, and analysis and evaluation after treatment were the same as those in Example 1.

As shown in Table 1, the atomic composition ratio of the surface of the treatment target after the treatment was, according to the XPS analysis, fluorine (F) 38.3 atom %, carbon (C) 43.6 atom %, nitrogen (N) 9.9 atom %, and oxygen (O) 8.2 atom %.

Therefore, the residual ratio of fluorine atoms on the surface of the treatment target after the treatment relative to the untreated state (before the treatment) was (38.3/67.6)=57.4%.

In addition, as hydrophilicity was enhanced after the treatment, it is presumed that a hydrogen atom-containing group such as OH, NH or CH was provided to the surface of the treatment target.

The peel strength measured by the peel test was good (Ø).

TABLE 1

| | Untreated PTFE | Example 1 | Example 2 |
|---|---|---|---|
| Discharge form | — | Dielectric barrier discharge | Dielectric barrier discharge |
| Hard-to-adhere material | PTFE | PTFE | PTFE |
| Carrier gas | — | N2 | N2 |
| Total flow rate | — | 50 L/min | 50 L/min |
| Additive | — | Carbon monoxide | Carbon dioxide |
| Added amount | — | 5 L/min | 10 L/min |
| E [J/cm$^2$] | — | 11.3 | 32.3 |
| F [atom %] | 67.6 | 5.5 | 38.3 |
| C [atom %] | 32.4 | 45.3 | 43.6 |
| N [atom %] | — | 28.9 | 9.9 |
| O [atom %] | — | 20.2 | 8.2 |
| F residual ratio [%] | — | 8.2 | 57.4 |
| Peel strength | X | ⊙ | ○ |

Comparative Example 1

As Comparative Example 1, the process gas was nitrogen ($N_2$) 100%. That is, no additive component was used.

The flow rate of the process gas ($N_2$) was 50 L/min.

The amount of energy input per unit area when the peel strength described later reached the maximum was E=10.35 J/cm$^2$.

Other treatment conditions, and analysis and evaluation after treatment were the same as those in Example 1.

As shown in Table 2, the atomic composition ratio of the surface of the treatment target after the treatment was, according to the XPS analysis, fluorine (F) 61 atom %, carbon (C) 35.1 atom %, nitrogen (N) 2.4 atom %, and oxygen (O) 1.5 atom %.

Therefore, the residual ratio of fluorine atoms on the surface of the treatment target after the treatment relative to the untreated state (before the treatment) was (61/67.6)=91.5%.

The peel strength measured by the peel test was poor (x).

Comparative Example 2

In Comparative Example 2, oxygen ($O_2$) was used as an additive component of the process gas.

The added amount was 0.05 L/min.

The amount of energy input per unit area when the peel strength described later reached the maximum was E=10.35 i/cm$^2$.

Other treatment conditions, and analysis and evaluation after treatment were the same as those in Example 1.

As shown in Table 2, the atomic composition ratio of the surface of the treatment target after the treatment was, according to the XPS analysis, fluorine (F) 60.3 atom %, carbon (C) 36.1 atom %, nitrogen (N) 2.4 atom %, and oxygen (O) 1.2 atom %.

Therefore, the residual ratio of fluorine atoms on the surface of the treatment target after the treatment relative to the untreated state (before the treatment) was (60.3/67.6)=90.4%.

The peel strength measured by the peel test was poor (x).

TABLE 2

| | Comparative Example 1 | Comparative Example 2 |
|---|---|---|
| Discharge form | Dielectric barrier discharge | Dielectric barrier discharge |
| Hard-to-adhere material | PTFE | PTFE |
| Carrier gas | N2 | N2 |
| Total flow rate | 50 L/min | 50 L/min |
| Additive | — | Oxygen |
| Added amount | — | 0.05 L/min |
| E [J/cm$^2$] | 10.35 | 10.35 |
| F [atom %] | 61 | 60.3 |
| C [atom %] | 35.1 | 36.1 |
| N [atom %] | 2.4 | 2.4 |
| O [atom %] | 1.5 | 1.2 |
| F residual ratio [%] | 91.5 | 90.4 |
| Peel strength | X | X |

Example 3

In Example 3, hydrogen ($H_2$) was used as an additive component of the process gas.

The added amount was 2 L/min.

The amount of energy input per unit area when the peel strength described later reached the maximum was E=56.3 J/cm$^2$.

Other treatment conditions, and analysis and evaluation after treatment were the same as those in Example 1.

As shown in Table 3, the atomic composition ratio of the surface of the treatment target after the treatment was, according to the XPS analysis, fluorine (F) 37.3 atom %, carbon (C) 50.9 atom %, nitrogen (N) 6.5 atom %, and oxygen (O) 5.4 atom %.

Therefore, the residual ratio of fluorine atoms on the surface of the treatment target after the treatment relative to the untreated state (before the treatment) was (37.3/67.6)=55.9%.

It is considered that the oxygen (O) in the surface atomic composition was derived from oxygen molecules ($O_2$) or carbon dioxide ($CO_2$) in the air as an atmospheric gas. It is considered that the nitrogen (N) was derived from nitrogen molecules ($N_2$) in the carrier gas and the air.

In addition, although hydrogen (H) cannot be detected by XPS, as hydrophilicity was enhanced after the treatment, it is presumed that a hydrogen atom-containing group such as OH, NH or CH was provided to the surface of the treatment target.

The peel strength measured by the peel test was excellent (⊙).

Example 4

In Example 4, water vapor ($H_2O$) was used as an additive component of the process gas.

The added amount was 2.17 g/min.

The amount of energy input per unit area when the peel strength described later reached the maximum was E=7 J/cm$^2$.

Other treatment conditions, and analysis and evaluation after treatment were the same as those in Example 1.

As shown in Table 3, the atomic composition ratio of the surface of the treatment target after the treatment was, according to the XPS analysis, fluorine (F) 28.3 atom %, carbon (C) 55.6 atom %, nitrogen (N) 9.6 atom %, and oxygen (O) 6.5 atom %.

Therefore, the residual ratio of fluorine atoms on the surface of the treatment target after the treatment relative to the untreated state (before the treatment) was (28.3/67.6)=42.4%.

In addition, as hydrophilicity was enhanced after the treatment, it is presumed that a hydrogen atom-containing group such as OH, NH or CH was provided to the surface of the treatment target.

The peel strength measured by the peel test was good (Ø).

Example 5

In Example 5, ethanol ($C_2H_5OH$) was used as an additive component of the process gas.

The added amount was 5.5 g/min.

The amount of energy input per unit area when the peel strength described later reached the maximum was E=11.3 J/cm$^2$.

Other treatment conditions, and analysis and evaluation after treatment were the same as those in Example 1.

As shown in Table 3, the atomic composition ratio of the surface of the treatment target after the treatment was, according to the XPS analysis, fluorine (F) 5 atom %, carbon (C) 56.1 atom %, nitrogen (N) 19.4 atom %, and oxygen (O) 19.5 atom %.

Therefore, the residual ratio of fluorine atoms on the surface of the treatment target after the treatment relative to the untreated state (before the treatment) was (5/67.6)=7.5%.

In addition, as hydrophilicity was enhanced after the treatment, it is presumed that a hydrogen atom-containing group such as OH, NH or CH was provided to the surface of the treatment target.

As a result of infrared light analysis, hydrogen atom-containing groups such as OH, NH, and CH were actually confirmed as shown in FIG. 5(*b*).

The peel strength measured by the peel test was excellent (⊙).

Other treatment conditions, and analysis and evaluation after treatment were the same as those in Example 1.

As shown in Table 4, the atomic composition ratio of the surface of the treatment target after the treatment was, according to the XPS analysis, fluorine (F) 16 atom %, carbon (C) 56.3 atom %, nitrogen (N) 13.6 atom %, and oxygen (O) 14.1 atom %.

Therefore, the residual ratio of fluorine atoms on the surface of the treatment target after the treatment relative to the untreated state (before the treatment) was (16/67.6)=24.0%.

In addition, as hydrophilicity was enhanced after the treatment, it is presumed that a hydrogen atom-containing group such as OH, NH or CH was provided to the surface of the treatment target.

The peel strength measured by the peel test was good (Ø).

TABLE 3

| | Example 3 | Example 4 | Example 5 |
|---|---|---|---|
| Discharge form | Dielectric barrier discharge | Dielectric barrier discharge | Dielectric barrier discharge |
| Hard-to-adhere material | PTFE | PTFE | PTFE |
| Carrier gas | N2 | N2 | N2 |
| Total flow rate | 50 L/min | 50 L/min | 50 L/min |
| Additive | Hydrogen | Water vapor | Ethanol |
| Added amount | 2 L/min | 2.17 g/min | 5.5 g/min |
| E [J/cm$^2$] | 56.3 | 7 | 11.3 |
| F [atom %] | 37.3 | 28.3 | 5 |
| C [atom %] | 50.9 | 55.6 | 56.1 |
| N [atom %] | 6.5 | 9.6 | 19.4 |
| O [atom %] | 5.4 | 6.5 | 19.5 |
| F residual ratio [%] | 55.9 | 42.4 | 7.5 |
| Peel strength | ⊙ | ○ | ⊙ |

Figure 4:
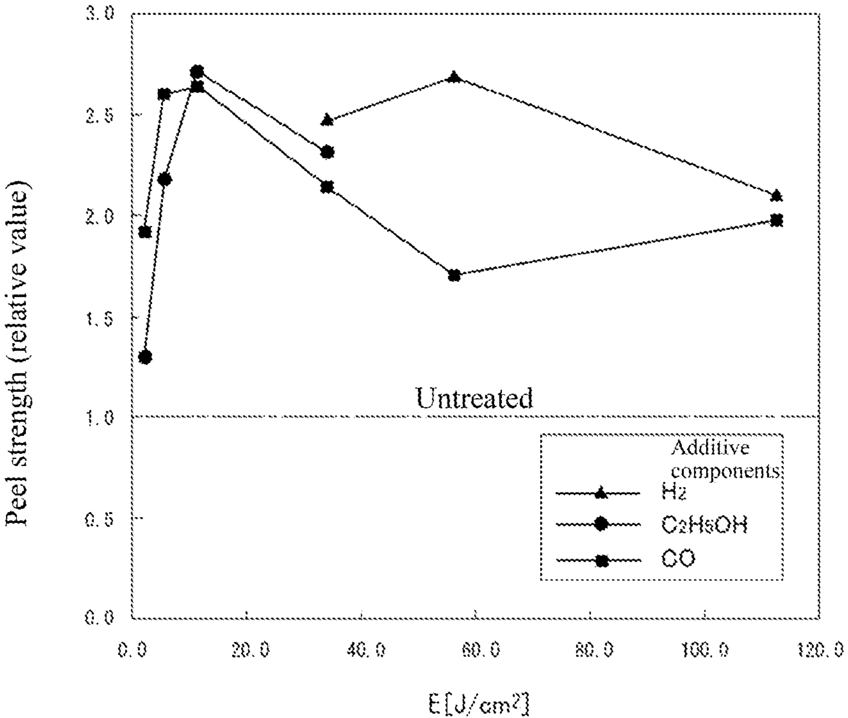
FIG. 4 is a graph showing the results of the measurement of the peel strength depending on the amount of energy input per unit area in Examples.

FIG. 4 shows the relationship between the amount of energy input per unit area (J/cm$^2$) and the peel strength for each additive component.

When the amount of energy input per unit area, E, is E=0.9 J/cm$^2$ to 135.0 J/cm$^2$, it can be said that the peel strength is improved and the surface modification effect is acquired.

Example 6

In Example 6, propanol ($C_3H_7OH$) was used as an additive component of the process gas.

The added amount was 2.5 g/min.

The amount of energy input per unit area when the peel strength described later reached the maximum was E=5.11 J/cm$^2$.

Other treatment conditions, and analysis and evaluation after treatment were the same as those in Example 1.

As shown in Table 4, the atomic composition ratio of the surface of the treatment target after the treatment was, according to the XPS analysis, fluorine (F) 14 atom %, carbon (C) 54 atom %, nitrogen (N) 16.5 atom %, and oxygen (O) 15.5 atom %.

Therefore, the residual ratio of fluorine atoms on the surface of the treatment target after the treatment relative to the untreated state (before the treatment) was (14/67.6)=21%.

In addition, as hydrophilicity was enhanced after the treatment, it is presumed that a hydrogen atom-containing group such as OH, NH or CH was provided to the surface of the treatment target.

The peel strength measured by the peel test was excellent (⊙).

Example 7

In Example 7, hexanol ($CH_3(CH_2)_5OH$) was used as an additive component of the process gas.

The added amount was 0.3 g/min.

The amount of energy input per unit area when the peel strength described later reached the maximum was E=5.11 J/cm$^2$.

Example 8

In Example 8, ethylene glycol ($C_2H_6O_2$) was used as an additive component of the process gas.

The added amount was 6 mg/min.

The amount of energy input per unit area when the peel strength described later reached the maximum was E=5.11 J/cm$^2$.

Other treatment conditions, and analysis and evaluation after treatment were the same as those in Example 1.

As shown in Table 4, the atomic composition ratio of the surface of the treatment target after the treatment was, according to the XPS analysis, fluorine (F) 20 atom %, carbon (C) 55.9 atom %, nitrogen (N) 12.3 atom %, and oxygen (O) 11.8 atom %.

Therefore, the residual ratio of fluorine atoms on the surface of the treatment target after the treatment relative to the untreated state (before the treatment) was (20/67.6)=30.0%.

In addition, as hydrophilicity was enhanced after the treatment, it is presumed that a hydrogen atom-containing group such as OH, NH or CH was provided to the surface of the treatment target.

The peel strength measured by the peel test was good (Ø).

Example 9

In Example 9, ammonia ($NH_3$) was used as an additive component of the process gas.

The added amount was 2.17 g/min.

The amount of energy input per unit area when the peel strength described later reached the maximum was E=2.05 J/cm$^2$.

Other treatment conditions, and analysis and evaluation after treatment were the same as those in Example 1.

As shown in Table 4, the atomic composition ratio of the surface of the treatment target after the treatment was, according to the XPS analysis, fluorine (F) 33.3 atom %, carbon (C) 52.3 atom %, nitrogen (N) 7 atom %, and oxygen (O) 7.4 atom %.

Therefore, the residual ratio of fluorine atoms on the surface of the treatment target after the treatment relative to the untreated state (before the treatment) was (33.3/67.6)=49.9%.

In addition, as hydrophilicity was enhanced after the treatment, it is presumed that a hydrogen atom-containing group such as OH, NH or CH was provided to the surface of the treatment target.

The peel strength measured by the peel test was good (Ø).

TABLE 4

| | Example 6 | Example 7 | Example 8 | Example 9 |
|---|---|---|---|---|
| Discharge form | Dielectric barrier discharge | Dielectric barrier discharge | Dielectric barrier discharge | Dielectric barrier discharge |
| Hard-to-adhere material | PTFE | PTFE | PTFE | PTFE |
| Carrier gas | N2 | N2 | N2 | N2 |
| Total flow rate | 50 L/min | 50 L/min | 50 L/min | 50 L/min |
| Additive | Propano | Hexanol | Ethylene glycol | Ammonia |
| Added amount | 2.5 g/min | 0.3 g/min | 6 mg/min | 2.17 g/min |
| E [J/cm$^2$] | 5.11 | 5.11 | 5.11 | 2.05 |
| F [atom %] | 14 | 16 | 20 | 33.3 |
| C [atom %] | 54 | 56.3 | 55.9 | 52.3 |
| N [atom %] | 16.5 | 13.6 | 12.3 | 7 |
| O [atom %] | 15.5 | 14.1 | 11.8 | 7.4 |
| F residual ratio [%] | 21.0 | 24.0 | 30.0 | 49.9 |
| Peel strength | ⊙ | ○ | ○ | ○ |

Example 10

In Example 10, a corona discharge device including a parallel plate electrode was prepared.

The hard-to-adhere material of the treatment target was film-shaped PTFE.

The treatment target was placed on the lower ground electrode of the pair of electrodes forming the parallel plate electrode, and was opposed to the upper hot electrode.

The additive component of the process gas was ethanol. The added amount was 5.5 g/min.

The carrier gas of the process gas was nitrogen ($N_2$), and the total flow rate of the process gas was 50 L/min.

The process gas was supplied to the interelectrode space, corona discharge was generated between the electrodes under the atmospheric pressure, and the surface of the treatment target was directly exposed to the corona discharge. The process gas activated by the corona discharge was brought into contact with the treatment target.

The amount of energy input per unit area when the peel strength described later reached the maximum was E=4.94 J/cm$^2$.

After the treatment, the measurement of the atomic composition of the surface of the treatment target, the calculation of the residual ratio of fluorine atoms, and the evaluation of the peel strength were performed in the same manner as in Example 1.

As shown in Table 5, the atomic composition ratio of the surface of the treatment target after the treatment was, according to the XPS analysis, fluorine (F) 26 atom %, carbon (C) 49.3 atom %, nitrogen (N) 12.1 atom %, and oxygen (O) 12.6 atom %.

Therefore, the residual ratio of fluorine atoms on the surface of the treatment target after the treatment relative to the untreated state (before the treatment) was (26/67.6)=38.5%.

In addition, as hydrophilicity was enhanced after the treatment, it is presumed that a hydrogen atom-containing group such as OH, NH or CH was provided to the surface of the treatment target.

The peel strength measured by the peel test was good (Ø).

Comparative Example 3

As a comparative example, the same corona treatment as in Example 10 was performed using a process gas with a total flow rate of 50 L/min obtained by adding 20 vol % of air to a carrier gas ($N_2$).

The amount of energy input per unit area when the peel strength described later reached the maximum was E=4.94 J/cm$^2$.

As shown in Table 5, the atomic composition ratio of the surface of the treatment target after the treatment was, according to the XPS analysis, fluorine (F) 63.6 atom %, carbon (C) 32.6 atom %, nitrogen (N) 2.6 atom %, and oxygen (O) 1.2 atom %.

Therefore, the residual ratio of fluorine atoms on the surface of the treatment target after the treatment relative to the untreated state (before the treatment) was (63.6/67.6)=94.1%.

The peel strength measured by the peel test was poor (x).

Example 11

In Example 11, film-shaped ETFE was applied as a hard-to-adhere material of a treatment target. The atomic composition of the surface of the blank (untreated) ETFE was fluorine (F) 48.9 atom % and carbon (C) 51.1 atom %.

The same plasma treating apparatus as that used in Example 1 was used as a treating apparatus.

The additive component of the process gas was ethanol ($C_2H_5OH$), and the added amount was 2.17 g/min.

The carrier gas of the process gas was nitrogen ($N_2$), and the total flow rate of the process gas was 50 L/min.

The process gas was supplied to the interelectrode space, atmospheric pressure plasma was generated between the electrodes, and the surface of the treatment target was directly exposed to the plasma. Further, the process gas activated by the plasma was brought into contact with the treatment target.

The amount of energy input per unit area was E=32.3 J/$cm^2$.

After the treatment, the measurement of the atomic composition of the surface of the treatment target, the calculation of the residual ratio of fluorine atoms, and the evaluation of the peel strength were performed in the same manner as in Example 1.

As shown in Table 5, the atomic composition ratio of the surface of the treatment target after the treatment was, according to the XPS analysis, fluorine (F) 4.9 atom %, carbon (C) 67 atom %, nitrogen (N) 16.6 atom %, and oxygen (O) 11.5 atom %.

Therefore, the residual ratio of fluorine atoms on the surface of the treatment target after the treatment relative to the untreated state (before the treatment) was (4.9/48.9)=10.0%.

In addition, as hydrophilicity was enhanced after the treatment, it is presumed that a hydrogen atom-containing group such as OH, NH or CH was provided to the surface of the treatment target.

The peel strength measured by the peel test was excellent (⊙).

TABLE 5

| | Example 10 | Comparative Example 3 | Example 11 | Untreated ETFE |
|---|---|---|---|---|
| Discharge form | Corona discharge | Corona discharge | Dielectric barrier discharge | — |
| Hard-to-adhere material | PTFE | PTFE | ETFE | ETFE |
| Carrier gas | N2 | N2 | N2 | — |
| Total flow rate | 50 L/min | 50 L/min | 50 L/min | — |
| Additive | Ethanol | Air | Ethanol | — |
| Added amount | 5.5 g/min | 20 vol % | 2.17 g/min | — |
| E [J/$cm^2$] | 4.94 | 4.94 | 32.3 | — |
| F [atom %] | 26 | 63.6 | 4.9 | 48.9 |
| C [atom %] | 49.3 | 32.6 | 67 | 51.1 |
| N [atom %] | 12.1 | 2.6 | 16.6 | — |
| O [atom %] | 12.6 | 1.2 | 11.5 | — |
| F residual ratio [%] | 38.5 | 94.1 | 10.0 | — |
| Peel strength | ○ | X | ⊙ | X |

From the Examples disclosed above, it has been found that using the method of the present invention, a good surface modification effect can be acquired through setting the conditions such that the residual ratio of fluorine atoms on a surface of a treatment target after treatment is about 60% or less. It has been found that, depending on the type of the additive component of the process gas, or the like, a more favorable surface modification effect can be acquired through setting the conditions such that the residual ratio is preferably about 20% or less, and more preferably about 10% or less.

INDUSTRIAL APPLICABILITY

The present invention can be applied to treatment for improving the wettability of fluorine-based hard-to-adhere materials such as PTFE and ETFE.

REFERENCE SIGNS LIST

1 surface modification device
1B, 1C surface modification device
9, 9B Hard-to-adhere resin film (treatment target)
10 process gas generation unit
13 gas supply line
14 nozzle
20 plasma generation unit
20C plasma head (plasma generation unit)
21*b* solid dielectric layer
22*b* solid dielectric layer
21, 21C hot electrode (electrode)
22 ground electrode (electrode, support portion)
22B roll electrode (electrode, support portion)
22C ground electrode (electrode)
23 interelectrode space (plasma discharge space)
24 power source
25 plasma head
27 movement mechanism
28 stage (support portion)

The invention claimed is:

1. A method for surface-modifying a treatment target made of a fluorine-based resin containing a fluorine atom, the method comprising:

a plasma step of activating a process gas containing any one selected from the group consisting of carbon monoxide, carbon dioxide, hydrogen, water vapor, ethanol, propanol, hexanol, ethylene glycol, and ammonia as an additive component by plasma and bringing the process gas into contact with the treatment target;

wherein the plasma step includes:

a generation step of generating plasma discharge near atmospheric pressure by applying an electric field to an interelectrode space defined by a pair of electrodes;

a supply step of supplying the process gas to the interelectrode space;

a contact step of bringing the process gas in the interelectrode space or having passed through the interelectrode space into contact with the treatment target; and a modification step of, through a reaction caused by the contact, adjusting a residual ratio of fluorine atoms on a surface of the treatment target to 60% or less of a residual ratio before the contact and providing a carbon atom, a hydrogen atom or an oxygen atom to the surface of the treatment target, wherein an amount of energy input in the plasma step is 0.9 J/$cm^2$ to 135.0 J/$cm^2$ per unit area of the surface of the treatment target, with the proviso that when the additive component is carbon monoxide, carbon dioxide, water vapor, ethanol, propanol, hexanol, ethylene glycol, or ammonia, the amount of energy input is 5 J/cm$^2$ to 60 J/cm$^2$, and when the additive component is hydrogen, the amount of energy input is 30 J/cm$^2$ to 120 J/cm$^2$.

2. The surface modification method according to claim 1, wherein the plasma step includes a step in which the treatment target passes through in the interelectrode space.

3. The surface modification method according to claim 1, wherein a peak-to-peak voltage of a voltage applied to between the pair of electrodes is 3 kVpp to 25 kVpp, and a frequency is 10 kHz to 70 KHz.

4. The surface modification method according to claim 1, wherein the treatment target is a film, the pair of electrodes includes a roll-shaped ground electrode and a hot electrode disposed facing the ground electrode, and in the plasma step, the treatment target is conveyed in contact with the ground electrode, and the plasma near the atmospheric pressure is generated between the ground electrode and the hot electrode.

5. The surface modification method according to claim 1, wherein the plasma step includes a step of applying a pulse wave-like voltage to between the pair of electrodes to generate pulse plasma near atmospheric pressure in the interelectrode space.

* * * * *